(12) United States Patent
Suga et al.

(10) Patent No.: US 7,686,912 B2
(45) Date of Patent: Mar. 30, 2010

(54) METHOD FOR BONDING SUBSTRATES AND METHOD FOR IRRADIATING PARTICLE BEAM TO BE UTILIZED THEREFOR

(75) Inventors: Tadatomo Suga, 3-6-3, Higashinakano, Nakano-ku, Tokyo 164-0003 (JP); Taehyun Kim, Pyungtaek-si (KR); Tomoyuki Abe, Himeji (JP)

(73) Assignees: Tadatomo Suga, Tokyo (JP); Ayumi Industry Co., Ltd., Hyogo (JP)

( * ) Notice: Subject to any disclaimer, the term of this patent is extended or adjusted under 35 U.S.C. 154(b) by 650 days.

(21) Appl. No.: 10/928,851

(22) Filed: Aug. 27, 2004

(65) Prior Publication Data
US 2005/0173057 A1    Aug. 11, 2005

(30) Foreign Application Priority Data
Aug. 29, 2003    (JP) ............................. 2003-308059

(51) Int. Cl.
*B32B 38/04* (2006.01)
(52) U.S. Cl. .............. 156/273.3; 156/272.2; 156/272.6; 438/406
(58) Field of Classification Search .............. 156/272.6, 156/272.2, 273.3, 153, 281; 438/455, 24, 438/27, 406; 257/E21.122, E21.567, E21.088; 148/DIG. 12
See application file for complete search history.

(56) References Cited

U.S. PATENT DOCUMENTS

| | | | | |
|---|---|---|---|---|
| 4,598,022 A | * | 7/1986 | Haque et al. ................. 428/413 |
| 4,999,215 A | * | 3/1991 | Akagi et al. ................. 427/488 |
| 5,383,993 A | * | 1/1995 | Katada et al. ................ 156/153 |
| 5,421,953 A | * | 6/1995 | Nagakubo et al. .............. 216/34 |
| 6,060,403 A | * | 5/2000 | Yasuda et al. ................ 438/765 |
| 6,180,496 B1 | | 1/2001 | Farrens et al. |
| 7,041,178 B2 | * | 5/2006 | Tong et al. .................. 148/33.4 |
| 2002/0073925 A1 | * | 6/2002 | Noble et al. .......... 118/723 ME |
| 2004/0235311 A1 | * | 11/2004 | Nakanishi et al. ........... 438/775 |

OTHER PUBLICATIONS

PCT International Application Publication Under the PCT; International Publication No. WO 99/10927;International Publication Date Mar. 4, 1999; International Application No. PCT/US98/17972; International Filing Date Aug. 28, 1998.
Technical Review vol. 5, No. 1, 2000 corresponds to JSME International Journal, Series A, vol. 40, No. 4, 1997 "Direct Bonding Between Aluminum and Silicon by the Formation of Hydrogen Bonds".
JSME International Journal; Solid Mechanics and Material Engineering; vol. 40 No. 4 Oct. 1997; Series A; Published by The Japan Society of mechanical Engineers.

* cited by examiner

Primary Examiner—John L Goff
Assistant Examiner—Daniel McNally
(74) Attorney, Agent, or Firm—Fox Rothschild LLP; Richard C. Woodbridge

(57) ABSTRACT

A substrate bonding method for mutually bonding substrates, has a first radiation step for irradiating the surfaces of the individual substrates with an oxygen particle beam, a second radiation step for irradiating the surfaces of the individual substrate with a nitrogen particle beam simultaneously with or subsequently to the first radiation step, and a step for stacking the individual substrates and bringing the surfaces thereof into close contact. Particularly, the substrates which have been irradiated first with an oxygen plasma and subsequently with a nitrogen plasma are stacked and bonded.

7 Claims, 10 Drawing Sheets

FIG. 17

| # | CONTENTS OF TREATMENT | TENSILE STRENGTH (MPa) | TENSILE STRENGTH (MPa) |
|---|---|---|---|
| 1 | SOLE RADIATION OF OXYGEN RADICAL | × | × |
| 2 | SOLE RADIATION OF NITROGEN RADICAL | × | × |
| 3 | SOLE RADIATION OF OXYGEN PLASMA | × | × |
| 4 | SOLE RADIATION OF NITROGEN PLASMA | × | × |
| 5 | SOLE RADIATION OF ARGON ION BEAM | × | × |
| 6 | RADIATION OF NITROGEN PLASMA AND SUBSEQUENT RADIATION OF OXYGEN RADICAL | × | × |
| 7 | RADIATION OF NITROGEN PLASMA AND SUBSEQUENT RADIATION OF OXYGEN PLASMA | × | × |
| 8 | RADIATION OF OXYGEN RADICAL AND SUBSEQUENT RADIATION OF NITROGEN RADICAL | × | × |
| 9 | RADIATION OF OXYGEN PLASMA AND SUBSEQUENT RADIATION OF NITROGEN RADICAL (REFERENTIAL EXAMPLE 1) | 4.5 | 10.9 (LIMIT OF ADHESIVE AGENT) |
| 10 | RADIATION OF OXYGEN PLASMA AND SUBSEQUENT RADIATION OF NITROGEN RADICAL (BEST EXAMPLE) | 18.9 (LIMIT OF ADHESIVE AGENT) | 20.0 (LIMIT OF ADHESIVE AGENT) |
| 11 | PLASMA RADIATION OF THE MIXTURE OF OXYGEN AND NITROGEN (REFERENTIAL EXAMPLE 2) | 3.7 | 8.7 (LIMIT OF ADHESIVE AGENT) |
| 12 | RADICAL RADIATION OF THE MIXTURE OF OXYGEN AND NITROGEN | × | × |

FIG. 18

|  | OXYGEN | NITROGEN |
|---|---|---|
| PRESSURE (PA) | 30 | 100 |
| RF VOLTAGE (V) | 200 | --- |
| MICRO-WAVE POWER (W) | --- | 2000 |
| DURATIONS (SEC) | 60 | 60 |

BONDING SUBSTRATES BY WEIGHTED AT 500 kgf
BONDING SUBSTRATES IN THE AIR (OR VACUUM)

METHOD FOR BONDING SUBSTRATES AND METHOD FOR IRRADIATING PARTICLE BEAM TO BE UTILIZED THEREFOR

CROSS REFERENCE TO RELATED APPLICATIONS

The present application is related to, and claims priority from, Japanese patent application no. 2003-308059 filed Aug. 29, 2003, the entire contents of which is hereby incorporated by reference in its entirety.

BACKGROUND OF THE INVENTION

1. Field of the Invention

This invention relates to a method for bonding substrates and an apparatus for bonding substrates, and a method for irradiating a particle beam and an apparatus for the irradiation which can be utilized therefor. Particularly, the method for bonding substrates and the apparatus for bonding substrates according to this invention are adapted to irradiate a plurality of kinds of particle beams with the object of exalting the strength of bonding substrates. The method for irradiation and the apparatus for irradiation according to this invention are adapted to effect the irradiation of the plurality of kinds of particles beams by the use of one device.

2. Description of Related Art

As a technique for mutually bonding such substrates as semiconductor substrates, the technique which is called "plasma assist bonding" has been attracting attention. For example, the technique which comprises irradiating the surfaces of substrates with an oxygen plasma ($O^+$ plasma), causing the oxygen plasma to react with the water component in the atmosphere thereby forming a hydroxyl group (OH group) on the surfaces of the substrates, and mutually bonding the substrates having a hydroxyl group formed thereon has been known to the art.

U.S. Pat. No. 6,180,496 discloses a technique for bonding substrates by bringing into mutual contact the surfaces thereof which have been irradiated with a plasma in a chamber having a bonding apparatus mounted thereon.

Such conventional techniques for bonding substrates as described above, however, have never embraced a contrivance directed toward exalting the strength of bonding substrates by the irradiation of a plurality of kinds of particle beams as by irradiating an oxygen plasma and a nitrogen radical in combination. The conventional techniques for bonding substrates, therefore, have possibly encountered difficulty in exalting the strength of bonding substrates fully satisfactorily. A simple and convenient method of irradiation which is capable of effecting plasma radiation and radical radiation by the use of one device has never been proposed to date.

SUMMARY OF THE INVENTION

An object of this invention resides in providing a method for bonding substrates and an apparatus therefor which are enabled to exalt the strength of bonding the substrates by irradiating the surfaces of the substrates with a plurality of kinds of particle beams. Particularly, this object consists in providing a method for bonding substrates and an apparatus therefor which are enabled to exalt the strength of bonding the substrates by irradiating the surfaces of the substrates with an oxygen plasma and a nitrogen radical.

Another object of this invention resides in providing a method for irradiation and an apparatus for irradiation which are enabled to effect plasma radiation and radical radiation by the use of one device.

According to an aspect of the invention, the method for mutually bonding substrates comprises a first radiation step for irradiating the surfaces of the individual substrates with an oxygen particle beam and a second radiation step for irradiating the surfaces of the individual substrates with a nitrogen particle beam simultaneously with or subsequently to the first radiation step. Then, after the first and the second radiation step, a bonding step for stacking the substrates and bonding their surfaces is carried out.

According to another aspect of the invention, a method for mutually bonding substrates comprises a first radiation step for irradiating the surfaces of the individual substrates with a plasma and a second radiation step for irradiating the surfaces of the individual substrates with a radical simultaneously with or subsequently to the first radiation step. Then, after the first and the second radiation step, a bonding step for stacking the substrates and bonding their surfaces is carried out.

According to still another aspect of the invention, a method for irradiating substrates with a plasma and a radical comprises a step of disposing substrate, a first electrode furnished with an opening, and a second electrode sequentially in the order mentioned as opposed to one another. Then, the irradiation of the substrate with the plasma is effected by grounding the first electrode while applying a high-frequency voltage to the substrate thereby inducing generation of a first plasma in a space between the first electrode and the substrate. On the other hand, the irradiation of the substrate with the radical is effected by grounding the first electrode while applying a high-frequency voltage to the second electrode thereby inducing generation of a second plasma in a space between the first electrode and the second electrode and, in consequence of this generation of the second plasma, enabling the radical to be passed through the opening in the first electrode and eventually made to irradiate the substrate.

According to a further aspect of the invention, an apparatus for mutually bonding substrates comprises a first irradiation unit for irradiating the surfaces of the individual substrates with an oxygen particle beam and a second irradiation unit for irradiating the surfaces of the individual substrates with a nitrogen particle beam simultaneously with or subsequently to the irradiation of the oxygen particle beam mentioned above. The apparatus is provided with a bonding unit for stacking the substrates and bonding the surfaces thereof which have been irradiated with the oxygen particle beam and the nitrogen particle beam.

According to a still further aspect of the invention, an apparatus for mutually bonding substrates comprises a chamber for accommodating substrate, a first electrode furnished with an opening, and a second electrode disposed therein sequentially in the order mention as opposed to one another, a piping for feeding the raw material gases for oxygen plasma and nitrogen radical into the chamber, a control unit for controlling the states of electrical connection of the substrate, the first electrode, and the second electrode, and a bonding unit for stacking the substrates and bonding the surfaces thereof which have been irradiated with the oxygen plasma and the nitrogen radical. The control unit, during the irradiation of the oxygen plasma, grounds the first electrode while applies a high-frequency voltage to the substrate, induces generation of an oxygen plasma consequently in a space between the first electrode and the substrate, and irradiates the surface of the substrate with the oxygen plasma mentioned above. On the other hand, the control unit, during the irradiation of the nitrogen radical, grounds the first electrode while applies a high-frequency voltage to the second electrode, induces generation of a nitrogen plasma in a space between the first electrode and the second electrode, and enables the nitrogen radical passed through the opening of the first electrode in consequence of the generation of the nitrogen plasma to irradiate the surface of the substrate.

According to a yet further aspect of the invention, an apparatus for irradiating the substrate with plasma and radical comprises a chamber for accommodating substrate, a first electrode furnished with an opening, and a second electrode disposed therein sequentially in the order mentioned as opposed to one another, a piping for feeding the raw material gases for an oxygen plasma and a nitrogen radical into the chamber, and a control unit for controlling the states of electrical connection of the substrate, the first electrode, and the second electrode. The control unit, during the irradiation of the oxygen plasma, grounds the first electrode while applies a high-frequency voltage to the substrate, induces generation of the oxygen plasma consequently in a space between the first electrode and the substrate, and enables the oxygen plasma to irradiate the surface of the substrate. On the other hand, the control unit, during the irradiation of the nitrogen radical, grounds the first electrode while applies a high-frequency voltage to the second electrode, induces generation of a nitrogen plasma consequently in a space between the first electrode and the second electrode, and enables the nitrogen radical passed through the opening of the first electrode in consequence of the generation of the nitrogen plasma to irradiate the surface of the substrate.

According to the method and the apparatus of this invention for bonding substrates, the substrates can be mutually bonded strongly by irradiating the surfaces of the individual substrates with an oxygen particle beam, irradiating the surfaces of the individual substrates with a nitrogen particle beam simultaneously therewith or subsequently thereto, stacking the substrates, and bonding the surfaces thereof.

Particularly, according to the method and the apparatus of this invention for bonding substrates, the substrates can be mutually bonded strongly by irradiating the surfaces of the individual substrates with a plasma, irradiating the surfaces of the individual substrates with a radical simultaneously therewith or subsequently thereto, and stacking the substrates, and bonding the surfaces thereof.

Further, according to the method and the apparatus of this invention for irradiation, the plasma radiation and the radical radiation both can be effected with one device by switching the states of application of voltage and grounding.

These and other features of the invention will be more fully understood by reference to the following drawings.

BRIEF DESCRIPTION OF THE DRAWINGS

FIG. 17 is a diagram showing the results of a test for tensile strength performed in a working example.

FIG. 18 is a diagram showing the conditions for an experiment of bonding substrates performed in the working example.

During the course of this description, like numbers will be used to identify like elements according to the different views that illustrate the invention.

DESCRIPTION OF THE PREFERRED EMBODIMENTS

Figure 1:
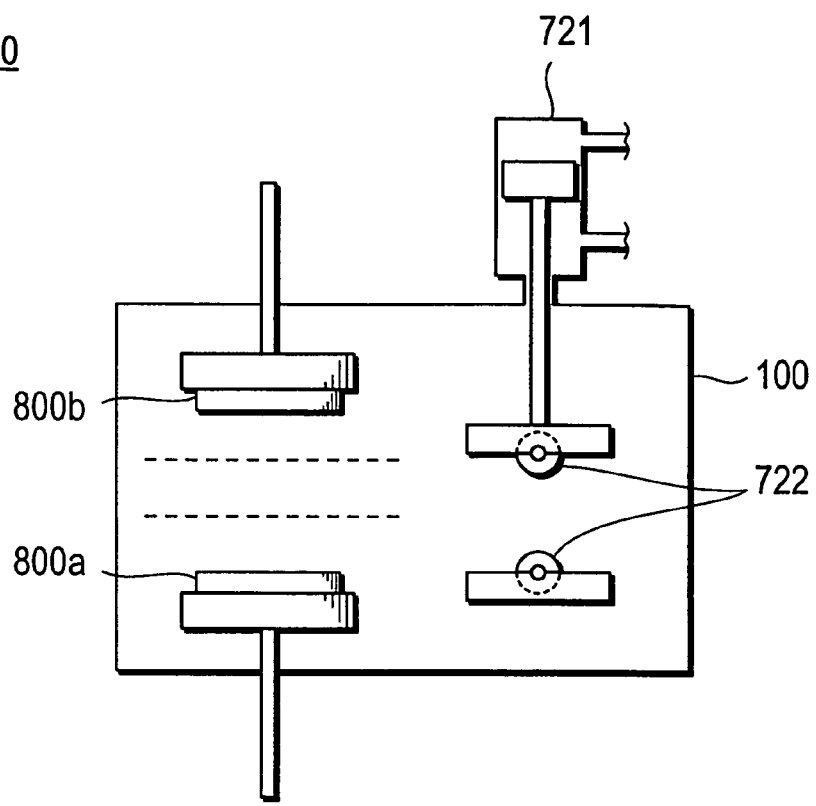
FIG. 1 is a diagram schematically illustrating the construction of an apparatus of this invention for bonding substrates in the first embodiment of the invention.

Now, preferred modes of embodying an apparatus of this invention for bonding substrates will be described in detail below with reference to the drawings attached hereto. Some of the dimensions in the drawings used for this description are exaggerated for the sake of clarification of the specification.

First Embodiment

The apparatus for bonding substrates in the present embodiment performs not only a function of irradiating the surfaces of the individual substrates with an oxygen particle beam but also a function of irradiating the surfaces of the individual substrates with a nitrogen particle beam. After the irradiation of the oxygen particle beam and the nitrogen particle beam, the substrates are stacked and the surfaces thereof are bonded.

The term "particle beam" as used herein embraces particle beams of all forms including ion beam, neutral atom beam, plasma, and radical. In the following description, however, as a preferred example, the case of irradiating an oxygen plasma and further irradiating a nitrogen radical and thereafter stacking the individual substrates, and bonding the surfaces thereof will be depicted. The apparatus for bonding substrates in the present embodiment is preferred to possess a construction such that the irradiation of plasma and the radiation of radical may be executed in one device.

FIG. 1 is a diagram schematically illustrating the construction of the apparatus for bonding substrates in the present embodiment. An apparatus 10 for bonding substrates is provided with a chamber 100. The chamber 100 is provided with an irradiation mechanism (irradiation unit) and bonding mechanism (bonding unit). The irradiation mechanism irradiates the surfaces of the substrates introduced therein with both an oxygen plasma ($O^+$) and a nitrogen radical (N radical). The bonding mechanism stacks the individual substrates 800a, 800b and bonds the surfaces thereof after they have been irradiated with the oxygen plasma and the nitrogen radical.

In the example illustrated in FIG. 1, the bonding mechanism is equipped with a loading cylinder 721 and work rollers 722 which are moved by the operation of the loading cylinder 721 in the direction of nipping the first substrate 800a and the second substrate 800b. The work rollers 722 admit the first substrate 800a and the second substrate 800b in their stacked form in to a nipped state and compress the first substrate 800a and the second substrate 800b into a bonded state. The bonding mechanism, however, does not need to be limited to the construction described above but may adopt a varying construction which is capable of bonding the surfaces of the first substrate 800a and the second substrate 800b.

Figure 2:
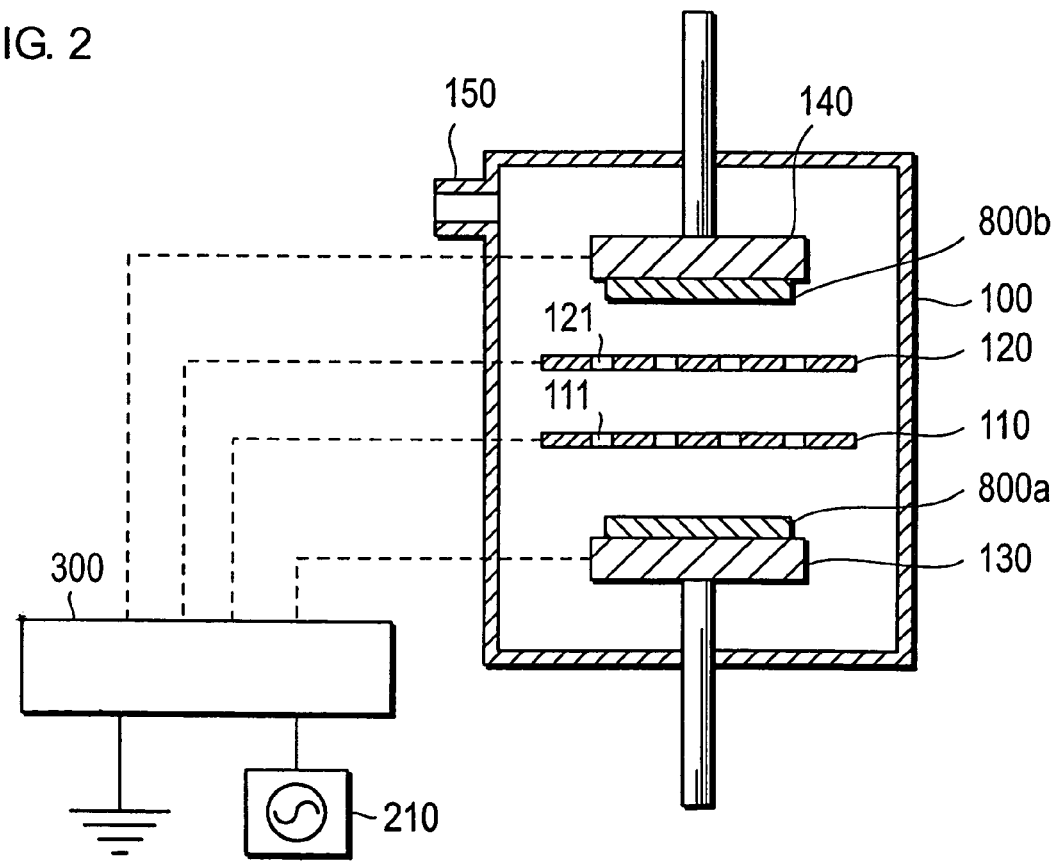
FIG. 2 is a diagram illustrating in type section the construction of an irradiation mechanism in the apparatus for bonding substrates shown in FIG. 1.

FIG. 2 is a diagram illustrating in type section the construction of an irradiation mechanism in the apparatus for bonding substrates in the present embodiment. Inside the chamber 100, the first substrate 800a, a first electrode 110, a second electrode 120, and the second substrate 800b are disposed sequentially in the order mentioned as illustrated in FIG. 2. The first substrate 800a and the second substrate 800b are supported respectively by a first supporting part 130 and a second supporting part 140.

The first electrode 110 and the second electrode 120 are formed of an electric conductor such as metal and are respectively provided with a plurality of openings 111, 121 (the first opening 111 and the second opening 121). The first supporting part 130 and the second supporting part 140 also function as a first substrate electrode and a second substrate electrode for applying voltage to the first substrate 800a and the second substrate 800b.

Then, the chamber 100 is provided with a gas piping (feed means) 150 for feeding the raw material gases for the oxygen plasma and the nitrogen radical into the chamber 100. As the raw material gas (gas seed) for the oxygen plasma, oxygen $O_2$, for example, is used. As the raw material gas for the nitrogen radical, nitrogen $N_2$, for example, is used.

Further, the substrate bonding apparatus 10 is furnished with one or a plurality of power sources 210. The power source 210 is intended to apply a high-frequency (RF) voltage of about 13 MHz to each of the first substrate 800a and the second substrate 800b. A power source for applying a voltage of other frequency may be used so long as it is capable of generating a plasma.

The substrate bonding apparatus 10 is furnished with a control part 300 (control means) for controlling the state of application of a voltage to the first electrode 110, the second electrode 120, the first substrate 800a, and the second substrate 800b and the state of grounding thereof. Owing to the control effected by this control part 300, the state of application of a voltage to the first electrode 110, the second electrode 120, the first substrate 800a, and the second substrate 800b and the state of grounding thereof are switched. By this switch, the treatment of irradiating the surfaces of the first substrate 800a and the second substrate 800b with a plasma, the treatment of irradiating the surface of the first substrate 800a with a radical, and the treatment of irradiating the surface of the second substrate 800b with a radical are properly switched. The contents of the control which is effected by the control part 300 will be described below.

(Treatment of Irradiating Plasma)

Figure 3:
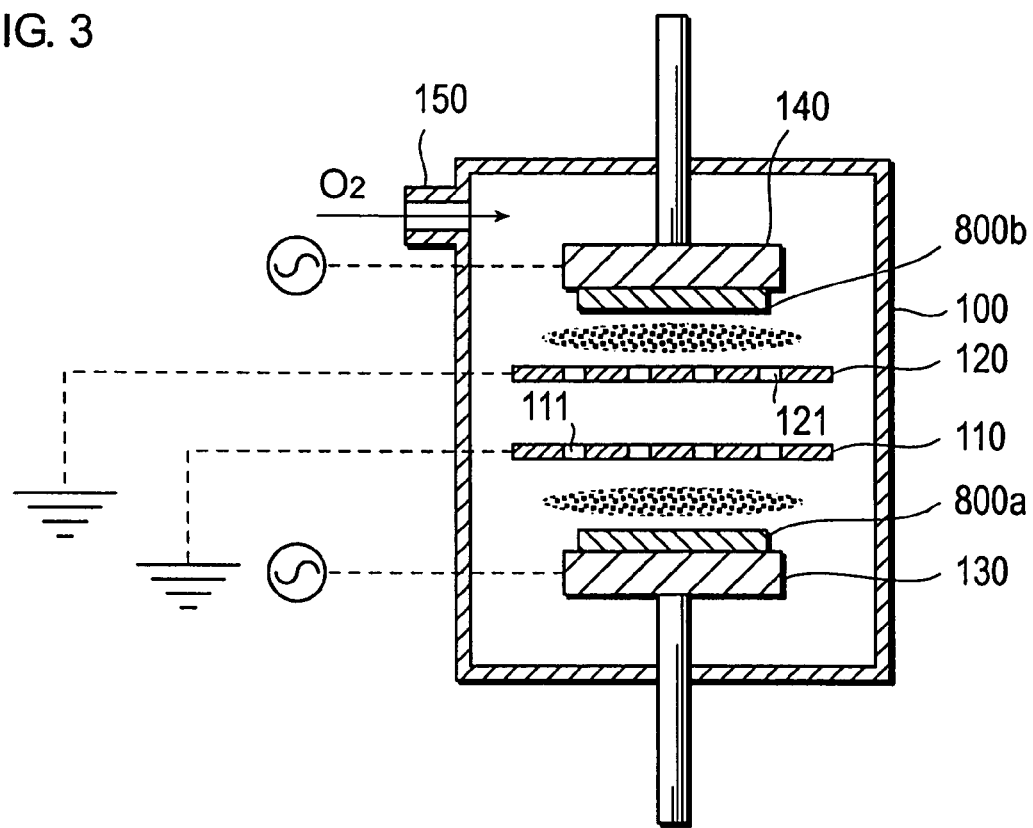
FIG. 3 is a diagram illustrating in type section the state which the irradiation mechanism of FIG. 2 assumes when it is irradiating a plasma.

FIG. 3 is a diagram illustrating in type section the state which the irradiation mechanism assumes when it irradiates a plasma. In irradiating an oxygen plasma, the control part 300 effects such a control as to ground the first electrode 110 and the second electrode 120 and meanwhile apply a high-frequency voltage to each of the first substrate 800a and the second substrate 800b (precisely the first substrate electrode 130 and the second substrate electrode 140).

By the application of the high-frequency voltage to the first substrate 800a, an RF plasma is generated in the space between the first electrode 110 and the first substrate 800a. The term "plasma" refers to an aggregate of low-pressure ionized atoms, electrons, and a neutral fragment and this plasma retains electrical neutrality as a whole. Specifically, the gas piping 150 feeds oxygen as a raw material gas and emits an oxygen plasma.

By the effect of the high frequency, a automatic C-bias voltage is generated between the plasma and the first substrate 800a and the first substrate 800a is irradiated with an oxygen ion. By a diffusion mechanism, the first substrate 800 is irradiated with not only the oxygen ion but also a neutral radical formed in the plasma.

By the same token, by the application of the high-frequency voltage to the second substrate 800b, an oxygen plasma is generated also in the space between the second electrode 120 and the second substrate 800b. Then, by the automatic C-bias voltage, the second substrate 800b is irradiated with an oxygen ion.

The treatment of irradiating the plasma which is effected as described above may well be called a treatment for irradiating an accelerated oxygen ion and a neutral radical.

(Treatment of Irradiating Radical)

Figure 4:
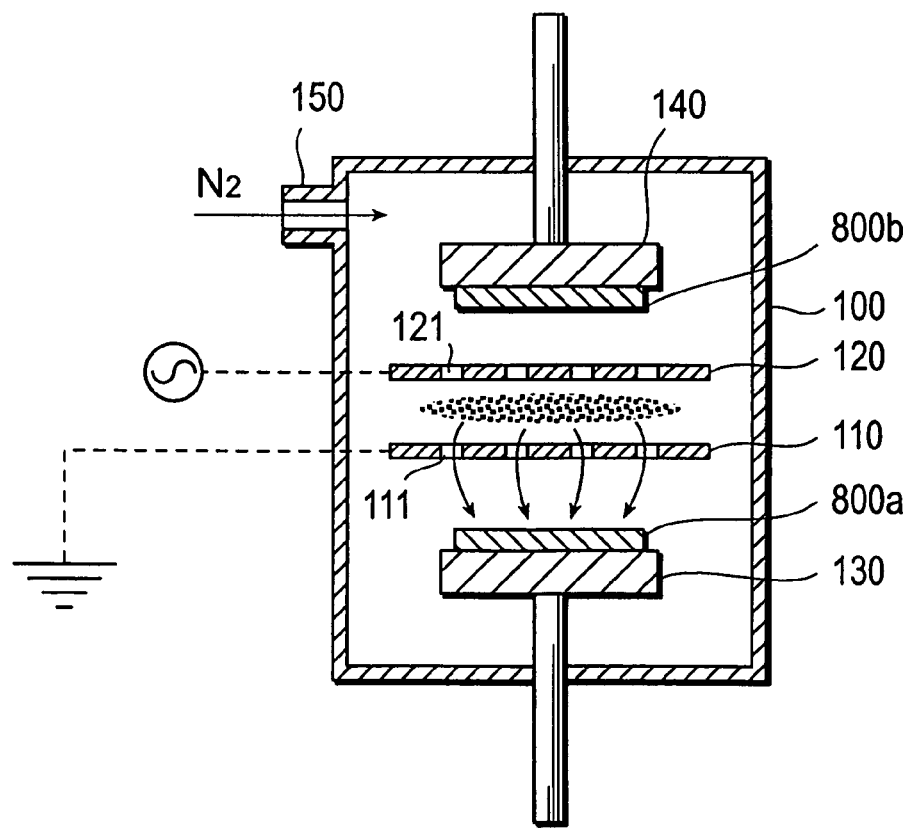
FIG. 4 is a diagram illustrating in type section the state which the irradiation mechanism of FIG. 2 assumes when it is irradiating the first substrate with a radical.

FIG. 4 is a diagram illustrating in type section the state which the irradiation mechanism assumes when it irradiate the first substrate with a radical. In irradiating a nitrogen radical, the control part 300 carries out the following control.

To irradiate the first substrate 800a with the nitrogen radical, the control part 300 effects such a control as to ground the first electrode 110 and meanwhile apply a high-frequency voltage to the second electrode 120. That is, the control part 300 is enabled to induce generation of a plasma in the space between the first electrode 110 and the second electrode 120 by grounding the first electrode 110 and, at the same time, applying a high-frequency voltage to the second electrode 120. To be specific, the gas piping 150 supplies nitrogen as a raw material gas. The nitrogen plasma is induced in the space.

Thus, the space between the first electrode 110 and the second electrode 120 functions as a source of plasma. The first substrate 800a, therefore, is disposed as separated from the source of plasma. When the nitrogen plasma occurs in a state of existing in the neighborhood of the openings 111 of the first electrode 110, only the neutral nitrogen radical is passed through the plurality of openings 111 formed in the first electrode 110 and conveyed onward. Since the nitrogen radical is electrically neutral, it is irradiated by the diffusion mechanism onto the first substrate 800a without being accelerated.

Figure 5:
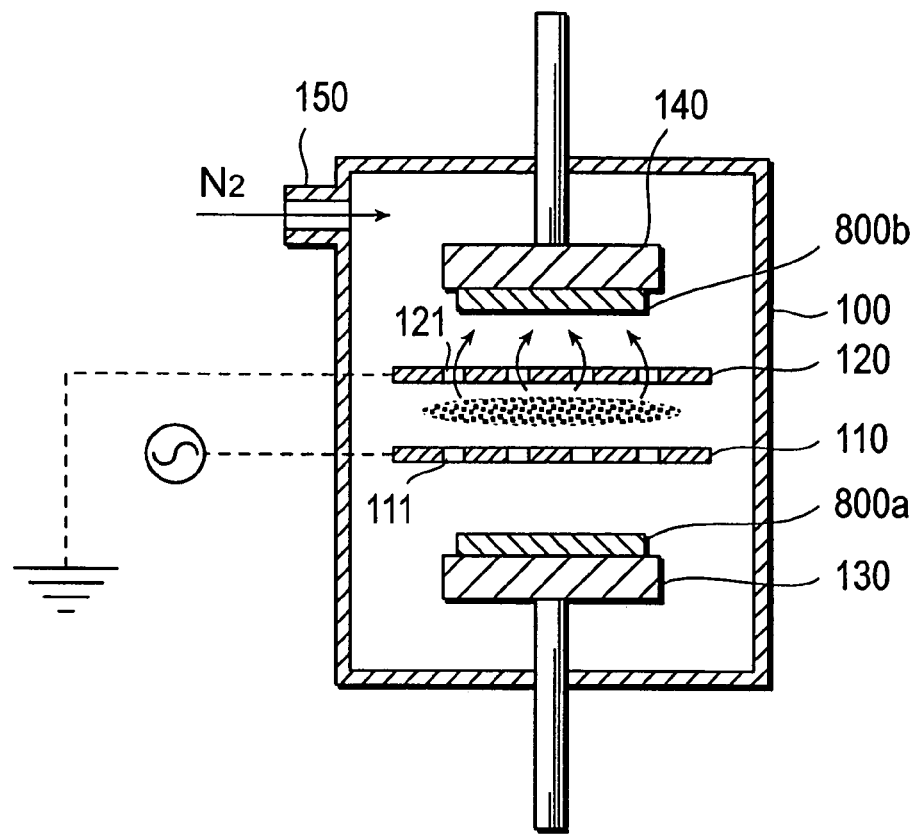
FIG. 5 is a diagram illustrating in type section the state which the irradiation mechanism of FIG. 2 assumes when it is irradiating the second substrate with a radical.

FIG. 5 is a diagram illustrating the state which the substrate bonding apparatus 10 assumes when it is irradiating the radical onto the second substrate. In irradiating the second substrate 800a with the nitrogen radical, the control part 300 effects such a control as to ground the second electrode 120 and meantime apply a high-frequency voltage to the first electrode 110. That is, the control part 300 is required to ground the second electrode 120 and, at the same time, apply the high-frequency voltage to the first electrode 110 in order to induce generation of the nitrogen plasma in the space between the first electrode 110 and the second electrode 120. Then, the neutral nitrogen radical which has passed the openings 121 of the second electrode 120 is irradiated onto the second substrate 800b.

The substrate bonding apparatus 10 in the present embodiment is enabled as a sole device to execute the radiation of a plasma and the radiation of a radical as described above. Then, by irradiating the nitrogen radical and further bringing the substrates 800a and 800b into mutual contact subsequently to the step of irradiating the oxygen plasma as described above, it is made possible to bond the first substrate 800a and the second substrate 800b strongly.

Now, the method for bonding substrates by the use of the substrate bonding apparatus 10 will be described below. Here, the case of using silicon (Si) substrates as the first substrate 800a and the second substrate 800b will be depicted.

FIG. 6-FIG. 9 are diagrams illustrating a method for bonding substrates in the present embodiment. In the following description which is made with reference to FIG. 6-FIG. 8, though only the first substrate 800a is actually shown as a substrate, it goes without saying that the second substrate 800b is processed similarly. Incidentally, in the case which is depicted in FIG. 6-FIG. 9, the process is carried out in the air at normal room temperature.

Figure 6:
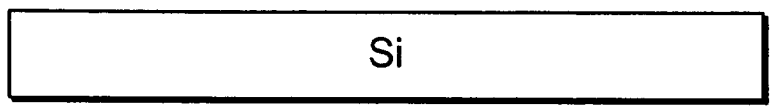
FIG. 6 through FIG. 9 are diagrams schematically illustrating a method for bonding substrates by the use of an apparatus for bonding substrates shown in FIG. 1.

FIG. 6 is a diagram illustrating a substrate prior to undergoing the process. At the step shown in FIG. 6, it is allowable for the surface of the first substrate 800a to be cleaned by exposure to inert gas particles.

Figure 7:
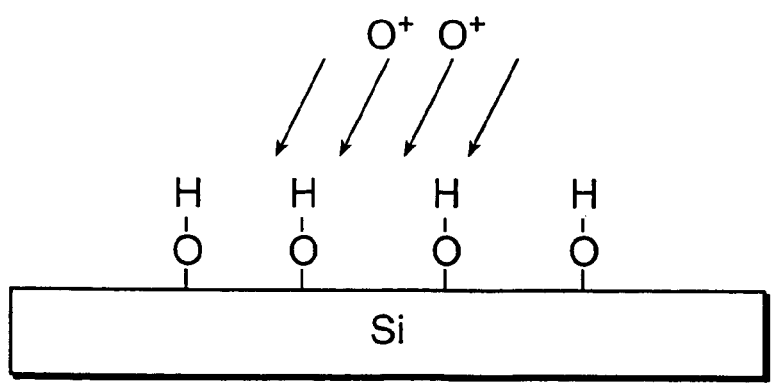

Next, the process of irradiating the surface of the first substrate 800a with a plasma (first irradiation step) as illustrated in FIG. 7 is carried out. To be specific, the process of irradiating the surface of the first substrate 800a with the oxygen plasma is carried out. As a result, the surface of the first substrate 800a is irradiated with the oxygen ion. In consequence of the process of FIG. 7, the surface of the substrate reacts with the water component in the atmosphere. Thus, it is inferred that the surface of the first substrate 800a forms a hydroxyl group (OH group) thereon.

Then, the process of irradiating the surface of the first substrate 800a with a radical (second irradiation step) is carried out subsequently to the process of FIG. 7. To be specific, the step of irradiating the surface of the first substrate 800a with a nitrogen radical is carried out. The first irradiation step illustrated in FIG. 7 and the second irradiation step illustrated in FIG. 8 may be simultaneously carried out. Otherwise, the second irradiation step may be carried out after the first irradiation step has been completed. The radiation of the radical, unlike the radiation of the plasma, inflicts only small damage on the surface of the substrate because it consists in radiating a particle beam which is electrically neutral and is not accelerated.

Figure 9:
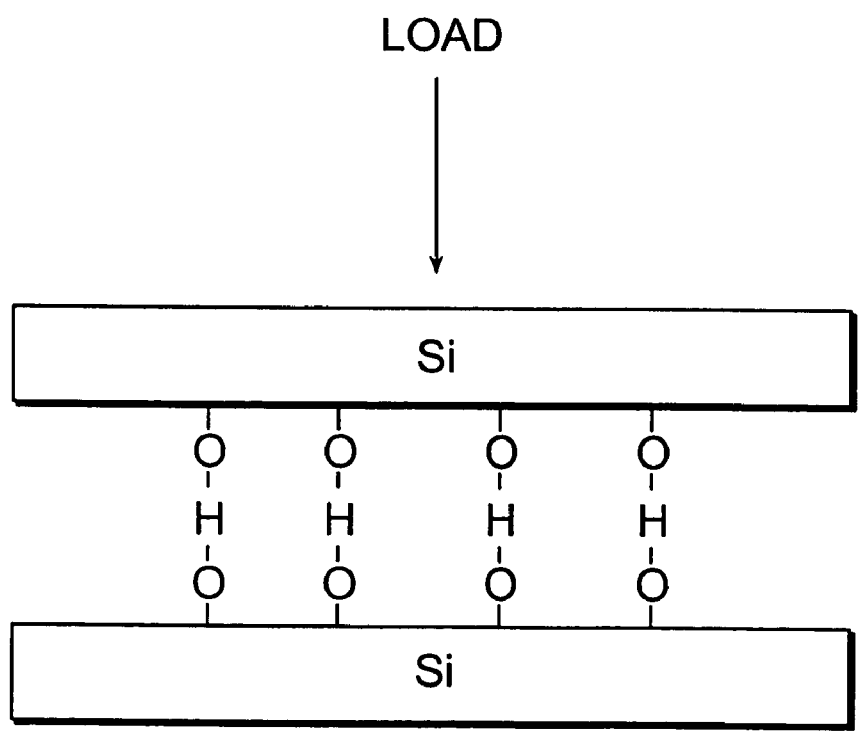

Next, the first substrate 800a and the second substrate 800b are stacked and their surfaces are brought into mutual contact as illustrated in FIG. 9 and they are weighted as occasion demands. As a result, the first substrate 800a and the second substrate 800b can be bonded.

Figure 8:
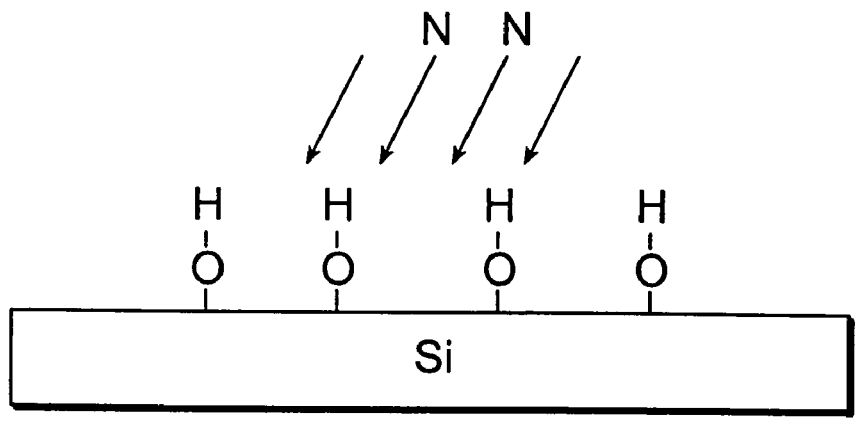

Particularly owing to the use of the substrate bonding apparatus 10 mentioned above, it is made possible to carry out the process of plasma radiation shown in FIG. 7 and the process of radical radiation shown in FIG. 8 continuously by the use of one device. Further, in the irradiation step, since the surface of the first substrate 800a and the surface of the second substrate 800b are disposed as opposed to each other, the operation of reversing the substrates by 180 degrees is no longer necessary when the surface of the first substrate 800a and the surface of the second substrate 800a are to be brought into union.

The combination of the radiation of the oxygen plasma and the radiation of the nitrogen radical results in realizing strong substrate bonding. Though the mechanism for this strong union remains yet to be elucidated in detail, it is inferred that this great strength is ascribable to the effect of using oxygen and nitrogen in combination as the gas seeds and the effect of using plasma and radical in combination. The exaltation of the strength of bonding substrates in consequence of the combined use of oxygen and nitrogen as gas seeds is possibly related to the formation of a oxinitride on the surfaces of the substrates. Then, the exaltation of the strength of bonding substrates in consequence of the combined use of plasma and radical is possibly related to the realization of a fine surface condition of some sort or other by the cooperation of the plasma radiation which includes accelerated particles and exerts a strong influence on the surfaces of the substrates and the radical radiation which inflicts only small damage to the surfaces of the substrates.

Second Embodiment

The first embodiment represents the case of disposing the first substrate 800a, the first electrode 110, the second electrode 120, and the second substrate 800b sequentially in the order mentioned and simultaneously irradiating the first substrate 800a and the second substrate 800b with a plasma. Though the process illustrated in the first embodiment proves preferable from the viewpoint of realizing a highly productivity, this invention does not need to be limited to that process.

The second embodiment represents the case of performing plasma radiation and radical radiation separately on the individual substrates. Like members used also in the first embodiment will be designated herein by like reference numerals. Further, since the supply of raw material gases and the process of bonding substrates in the present case are similar to those in the first embodiment, their detailed descriptions will be omitted here.

Figure 10:
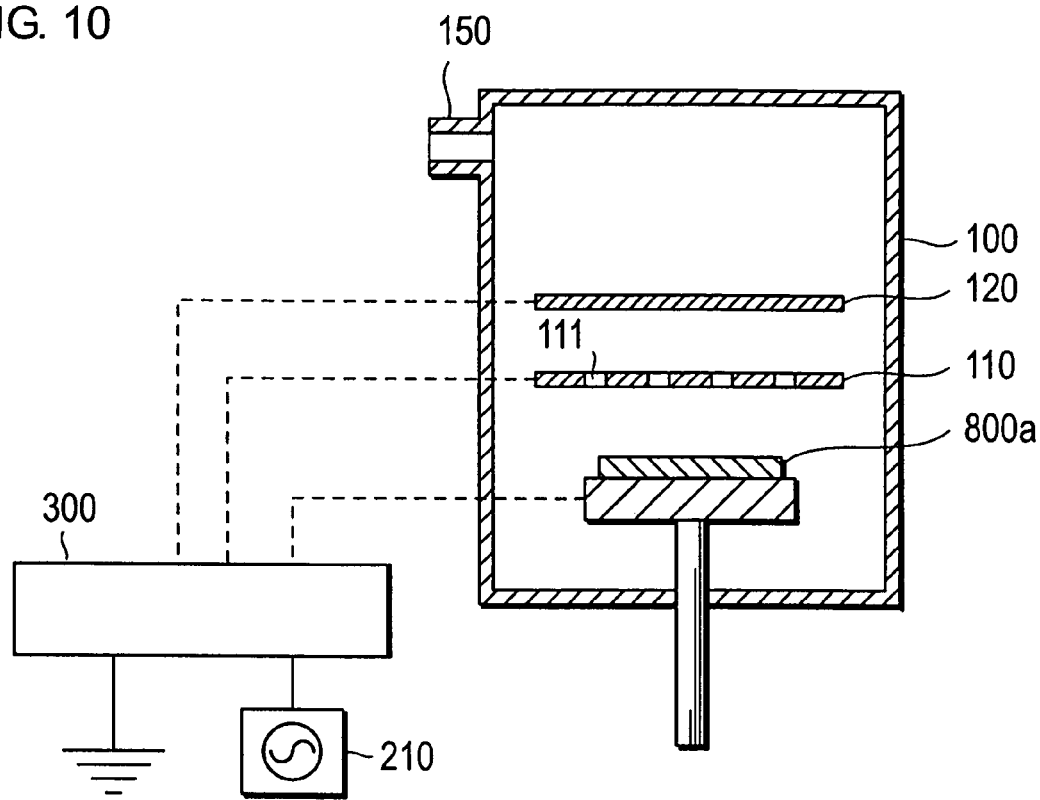
FIG. 10 is a diagram illustrating in type section the construction of an irradiation mechanism in an apparatus for bonding substrates in the second embodiment.

FIG. 10 is a diagram illustrating in type section the construction of an irradiation mechanism in the substrate bonding equipment according to the present embodiment. Though FIG. 10 depicts the case of performing plasma radiation and radical radiation on the first substrate 800a, the second substrate 80b is processed similarly. Inside the chamber 100, the first substrate 800a, the first electrode 110 furnished with openings 111, and the second electrode 120 are disposed sequentially in the order mentioned as opposed to one another as illustrated in FIG. 10. In the present embodiment, the second electrode is not required to be furnished with an opening.

At the step of plasma radiation, the control part 300 effects such a control as to ground the first electrode 110 and, at the same time, apply a high-frequency voltage to the first substrate 800a (more precisely a substrate electrode). As a result, an oxygen plasma is generated in the space between the first electrode 110 and the first substrate 800a and the surface of the first substrate 800a is irradiated with this oxygen plasma. At the step of radical radiation, on the other hand, the control part 300 effects such a control as to ground the first electrode 110 and, at the same time, apply the high-frequency voltage to the second electrode. As a result, a nitrogen plasma is generated in the space between the first electrode 110 and the second electrode 120 and the first substrate 800a is irradiated with a neutral nitrogen radical which has passed the openings of the first electrode 110 in consequence of the generation of the nitrogen plasma.

When the process performed on the first substrate 800*a* is completed, the same plasma radiation and radical radiation are carried out also on the second substrate 800*b*. Then, the first substrate 800*a* and the second substrate 800*b* are stacked and their surfaces are brought into mutual contact and they are bonded as weighted as occasion demands. Thus, also in the present embodiment, strong bonding of substrates can be realized.

Third Embodiment

The first embodiment and the second embodiment represent the cases of inducing generation of oxygen plasma and nitrogen plasma by applying the high-frequency (RF) voltage during the plasma radiation and the radical radiation.

The method of excitation to be used for the generation of plasma does not need to be limited to the recourse to the high frequency (RF). It goes without saying that the excitation may be attained by using a varying means such as, for example, low frequency, micro-wave, helicon wave, or surface wave.

In the present embodiment, the plasma required for the sake of the plasma radiation is generated by the application of the high-frequency (RF) voltage. On the other hand, in preparation for the radical radiation, the plasma is generated by the application of a micro-wave and, during the course of this plasma generation, the substrate is irradiated with the radical which has passed the prescribed openings. In the present embodiment, the supply of the raw material gases and the process for mutually stacking the substrates and weighting them for strong union are the same as those in the first embodiment. Their detailed descriptions, therefore, will be omitted here.

Figure 11:
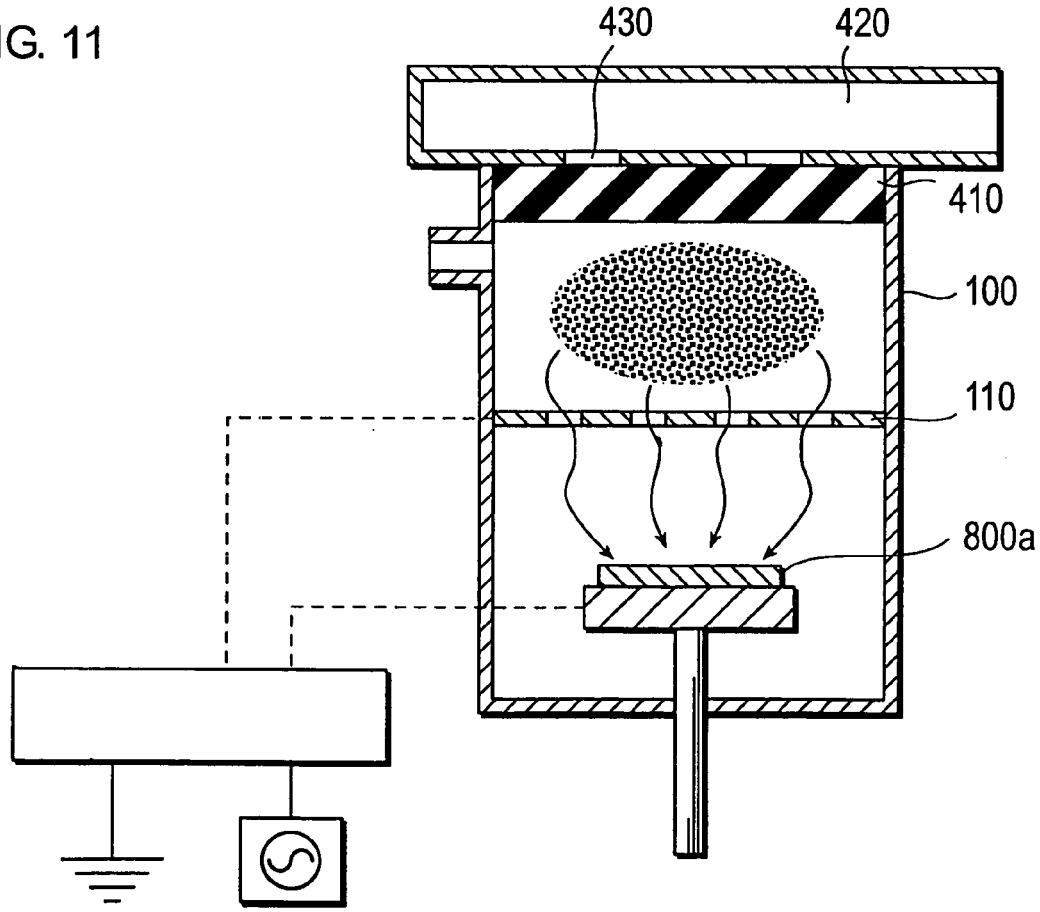
FIG. 11 is a diagram illustrating in type section the construction of an irradiation mechanism in an apparatus for bonding substrates in the third embodiment.

FIG. 11 is a diagram illustrating in type section the construction of an irradiation mechanism in the substrate bonding apparatus of the present embodiment. Inside the chamber 100 shown in FIG. 11, the first substrate 800*a*, the first electrode 110 which is a conductor plate furnished with a plurality of openings, and a dielectric plate 410 are disposed sequentially in the order mentioned. To the dielectric plate 410, a micro-wave guide tube 420 is connected through the medium of a slot antenna part 430. The micro-wave guide tube 420 discharges a role of transmitting a micro-wave having a frequency of about 2.45 GHz to the dielectric plate 410 through the medium of the slot antenna part 430. By the micro-wave which has been transmitted to the dielectric plate 410, a plasma is generated.

By the substrate bonding apparatus according to the present embodiment, the following process is carried out. At the step of plasma radiation, similarly to that in the second embodiment, the first electrode 110 is grounded and, at the same time, the first substrate 800*a* (precisely the substrate electrode) is subjected to application of the high-frequency voltage. As a result of the operation of this step, an oxygen plasma is generated in the space between the first electrode 110 and the first substrate 800*a* and this oxygen plasma is made to irradiate the surface of the first substrate 800*a*. As the high-frequency voltage, a voltage 200 V in force and 13 MHz in frequency, for example, is used.

Meanwhile, at the step of radical radiation, the first electrode 110 is grounded and, at the same time, a micro-wave is transmitted to the dielectric plate 410 by the micro-wave guide tube 420. As a result, a nitrogen plasma is generated in the space between the first electrode 110 and the dielectric plate 420. Then, in consequence of the generation of the nitrogen plasma, the nitrogen radical which has passed the openings of the first electrode 110 is made to irradiate the first substrate 800*a*. FIG. 11 illustrates in type section the case of effecting radical radiation.

Also by the present embodiment, radiation of a nitrogen radical can be effected subsequently to the radiation of an oxygen plasma. The first substrate 800*a* and the second substrate 800*b* which have undergone these radiations can be mutually bonded strongly by stacking them and bringing their surfaces into close mutual contact.

Fourth Embodiment

The first embodiment described above represents the case of using the first electrode 110 and the second electrode 120 thereby effecting the radiation of an oxygen plasma and the radiation of a nitrogen radical with one device. The present embodiment represents the case of not only radiating an oxygen plasma and radiating a nitrogen radical but also radiating such a neutral atom beam of an inert gas as an argon atom beam.

Figure 12:
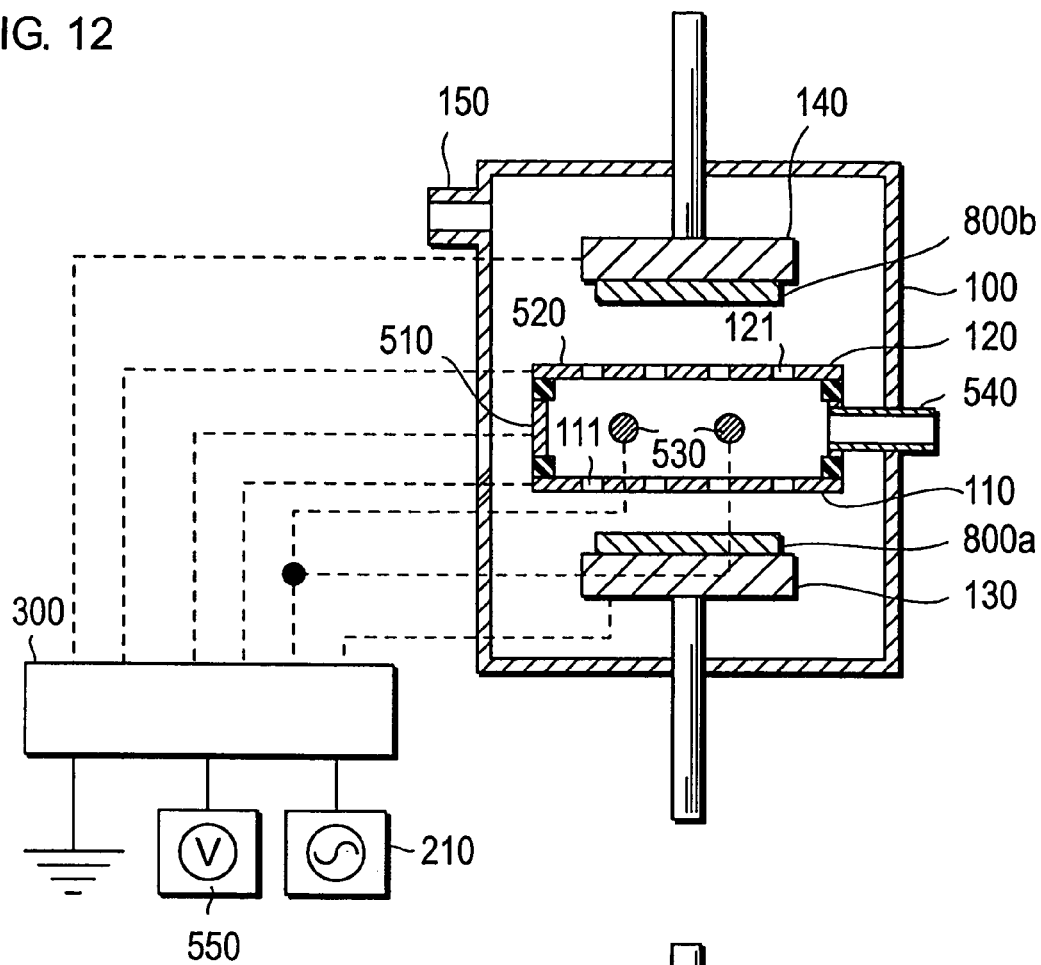
FIG. 12 is a diagram illustrating in type section the construction of an irradiation mechanism in an apparatus for bonding substrates in the fourth embodiment.

FIG. 12 is a diagram illustrating in type section the construction of an irradiation mechanism in a substrate bonding apparatus of the present embodiment. In the chamber 100 shown in FIG. 12, the first substrate 800*a*, the first electrode 110, the second electrode 120 and the second substrate 800*b* are disposed sequentially in the order mentioned. The first electrode 110 and the second electrode 120 are provided respectively with a plurality of openings 111 and 121 (the first openings 111 and the second openings 121). The first supporting part 130 and the second supporting part 140 which are intended to support the first substrate 800*a* and the second substrate 800*b* function as a first substrate electrode and a second substrate electrode for applying voltage respectively to the first substrate 800*a* and the second substrate 800*b*. These points are similar to those involved in the first embodiment.

As a construction characteristic of the present embodiment, the chamber 100 is provided therein with a surrounding wall member 510 and the first electrode 110 and the second electrode 120 are so disposed as to close the opposite terminals of the surrounding wall member 510. The surrounding wall member 510 is formed of such an electrically conductive substance as metal. Here, the mutual fit between the surrounding wall member 510 and the first electrode 110 and that between the surrounding wall member 510 and the second electrode 120 are each attained through the medium of an insulating member 520. Consequently, the surrounding wall member 510, the first electrode 110, and the second electrode 120 are electrically insulated separated.

Further, in the space between the first electrode 110 and the second electrode 120, a pair of stick inner electrodes 530 are disposed parallel as to the first electrode 110 and the second electrode 120. More specifically, the inner electrode 530 is disposed within the space which is enclosed with the first electrode 110, the second electrode 120, and the surrounding wall member 510. In addition to the gas piping 150 mentioned above, a second gas piping 540 for introducing a gas may be disposed inside the space.

Then, the substrate bonding apparatus 10 is furnished with the power source 210 which is intended to apply a voltage of such high frequency (RF) as, for example, about 13 MHz to each of the first substrate 800*a* and the second substrate 800*b*. The substrate bonding apparatus 10 is also furnished with a DC power source 550 intended to apply a direct current voltage to the pair of inner electrodes 530.

Further, the control part 300 of the present embodiment not only controls the state of application of the voltage to the first electrode 110, the second electrode 120, the first substrate 800a, and the second substrate 800b and the state of grounding thereof but also controls the application of the voltage to the inner electrode 530 and the grounding of the surrounding wall member 510.

By the control which is effected by the control part 300, the state of application of the voltage to the first electrode 110, the second electrode 120, the first substrate 800a, the second substrate 800b, the inner electrode 530, and the surrounding wall member 510 and the state of grounding thereof are switched. By this control part 300, it is made possible not only to switch the process for plasma radiation and the process for radical radiation but also to switch the process for radiation of the inert gas neutral atom beam. That is, the apparatus of the present embodiment used as a sole device suffices for realizing three kinds of radiation process, i.e. the process for plasma radiation, the process for radical radiation, and the process for neutral atom beam radiation. The process for neutral atom beam radiation may be carried out for the purpose of cleaning the surfaces of the substrates prior to the process for oxygen plasma radiation and the process for nitrogen radical radiation. Now, the contents of the control which is effected by the control part 300 will be described below. The present embodiment will be described as representing the case of radiating a argon neutral atom beam.

(Process for Radiation of Neutral Atom Beam)

Figure 13:
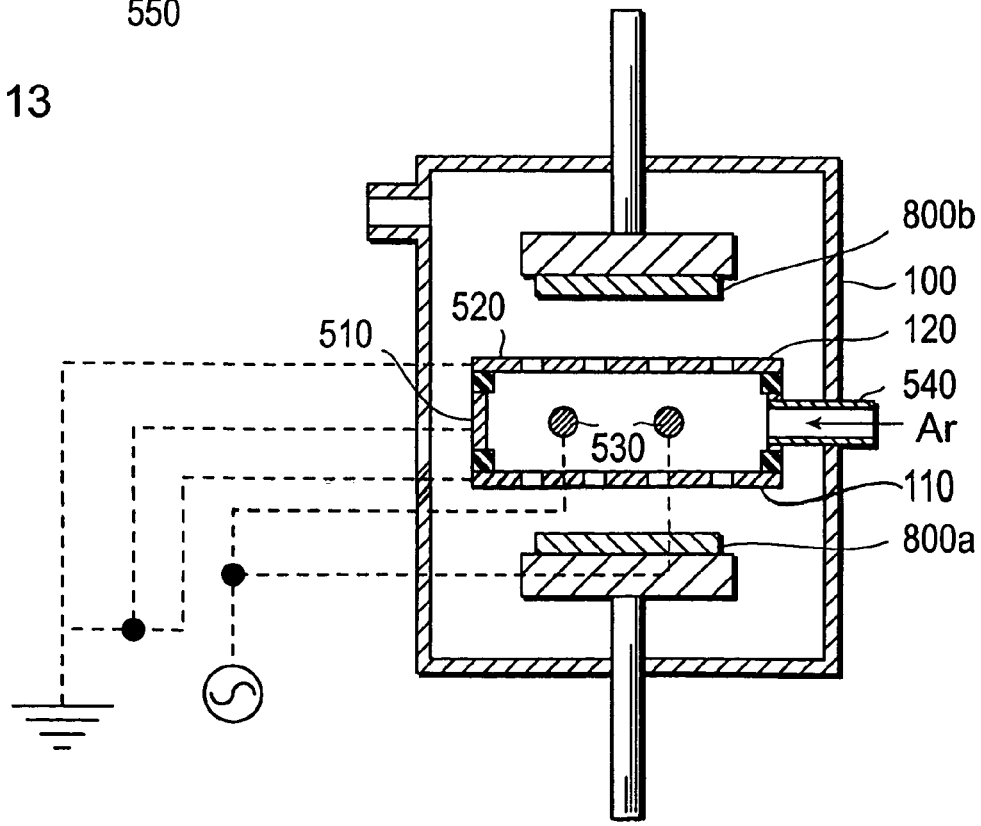
FIG. 13 is a diagram illustrating in type section the state which the irradiation mechanism of FIG. 12 assumes when it is irradiating a neutral atom beam.

FIG. 13 is a diagram illustrating in type section the state which the radiation mechanism assumes when it radiates a neutral atom beam. In starting the radiation of a neutral atom beam, the control part 300 applies a direct current voltage to the inner electrode 530 and, at the same time, effects such a control as to ground the first electrode 110, the second electrode 120, and the surrounding wall member 510.

By the fact that the direct current voltage is applied to the inner electrode 530 while the supply of argon gas through the second gas piping is in process, the argon gas transforms to a state of plasma and generates argon ion. Then, the generated argon ion, by the electrical field based on the direct current voltage, is advanced to the first electrode 110 and the second electrode 120, neutralized, and made to generate an argon neutral atom beam. The argon neutral atom beam thus generated is passed through the openings 111 and 112 formed respectively in the first electrode 110 and the second electrode 120 and made to irradiate the first substrate 800a and the second substrate 800b.

(Process for Plasma Radiation and Process for Radical Radiation)

The process for the plasma radiation and the process for the radical radiation are fundamentally similar to those involved in the case of the first embodiment. In this case, since the first electrode 110, the second electrode 120, and the surrounding wall member 510 are electrically insulated, the first electrode 110 and the second electrode 120 have no possibility of being short-circuited through the medium of the surrounding wall member 510.

Now, the method for bonding substrates by the use of the substrate bonding apparatus 10 constructed as described above will be explained below. First, the direct current voltage is applied to one pair of inner electrodes 530 and, at the same time, the first electrode 110, the second electrode 120, and the surrounding wall member 510 are grounded. As a result, the inner electrode 530 assumes a state of being surrounded with grounded metal members. The argon gas is transformed by the direct current voltage to a state of plasma and finally the argon neutral atom beam is made to irradiate the first substrate 800a and the second substrate 800b. As a result, the surfaces of the first substrate 800a and the second substrate 800b are cleaned.

Next, similarly to the process demonstrated in the first embodiment, the oxygen plasma and the nitrogen radical are continuously radiated by switching the state of application of the voltage to the first electrode 110, the second electrode 120, the first substrate 800a, and the second substrate 800b and the state of grounding them. Then, finally, by stacking the first substrate 800a and the second substrate 800b and bringing their surfaces into close contact, when necessary, in a weighted state, the first substrate 800a and the second substrate 800b are bonded.

In the present embodiment, the first electrode 110 and the second electrode 120 which are used for radiating an oxygen plasma and a nitrogen radical may be concurrently used as part of the mechanism for generating a neutral atom beam. The necessity for separately attaching an extra source for the generation of a neutral atom beam generation for the purpose of cleaning the first substrate 800a and the second substrate 800b ceases to exist.

Fifth Embodiment

The first embodiment has represented the case of effecting radiation of a plurality of kinds of particle beam by switching the state of application of voltage to the first electrode, the second electrode, the first substrate 800a, and the second substrate 800b and the state of grounding them. The present embodiment is illustrated by citing the case of using a coil for the generation of inductively coupled plasma (ICP) in the place of the first electrode and the second electrode.

Figure 14:
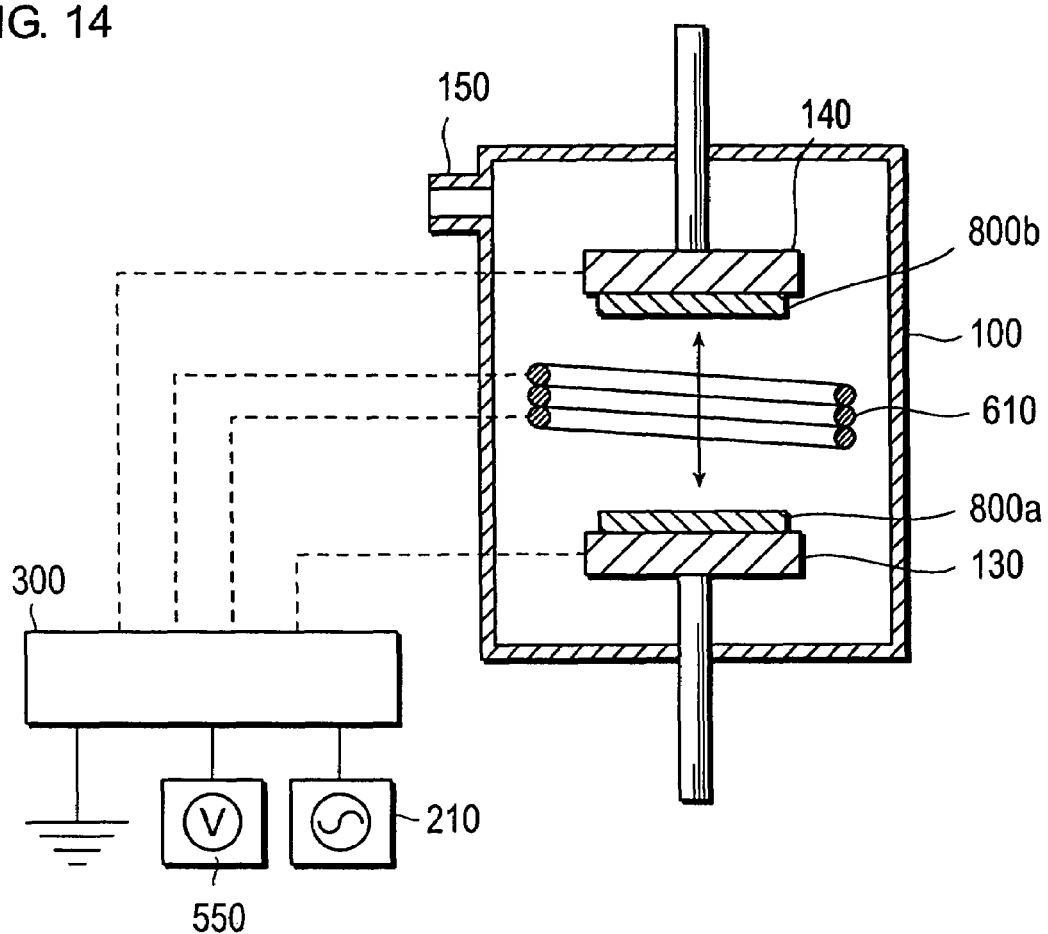
FIG. 14 is a diagram illustrating in type section the construction of an irradiation mechanism in an apparatus for bonding substrates in the fifth embodiment.

FIG. 14 is a diagram illustrating in type section the construction of a radiation mechanism of the substrate bonding apparatus of the present embodiment. In the chamber 100 shown in FIG. 14, the first substrate 800a, a coil 610, and the second substrate 800b are disposed sequentially in the order mentioned as opposed to one another. Since the construction of the first supporting part 130, the second supporting part 140, and the gas piping 150 is the same as that in the case of the first embodiment, it will be omitted from the following detailed description.

The coil 610 is wound around along the parallel surfaces of the first substrate 800a and the second substrate 800b. In other words, the winding axis of the coil 610 is perpendicular to the first substrate 800a and the second substrate 800b. The coil 610 of this construction is what is ordinarily called a columnar coil and it is formed by winding an electric wire in several turns or so or in a still larger number. The coil 610 is used for the purpose of generating a high-frequency induction field. The coil 610 is disposed in the proximity of the intermediate point between the first substrate 800a and the second substrate 800b.

The coil 610 is preferred to be formed in a diameter larger than the diameters of the first substrate 800a and the second substrate 800b. In other words, the coil 610 is preferred to be formed in such a diameter that the first substrate 800a and the second substrate 800b may pass through the coil 610 of an annular shape without touching the coil 610 as shown by the arrow mark in FIG. 14.

The substrate bonding apparatus 10 is furnished with the power source 210 for applying a high-frequency (RF) voltage of about 13 MHz to each of the first substrate 800a and the second substrate 800b and a power source 620 for applying a high-frequency voltage of about 2 MHz to the coil 610. Power sources capable of applying voltages of other frequencies, when necessary, may be adopted in the place of the power source 210 and the power source 620 for the coil.

The substrate bonding apparatus 10 is furnished with the control part 300 which is intended to control the state of application of voltage to the first substrate 800*a*, the second substrate 800*b*, and the coil 610 and the state of grounding them. By the control effected by this control part 300, the state of application of voltage to the first substrate 800*a* and the second substrate 800*b* and the state of grounding them is switched. Then, by this control part 300, the process for irradiating the surfaces of the first substrate 800*a* and the second substrate 800*b* with the RF plasma and the process for irradiating the surfaces of the first substrate 800*a* and the second substrate 800*b* with the ion and/or the radical generated from the inductively coupled plasma is properly switched. Now, the contents of the control which is effected by the control part 300 will be described below.

(Process for Radiation of RF Plasma)

Figure 15:
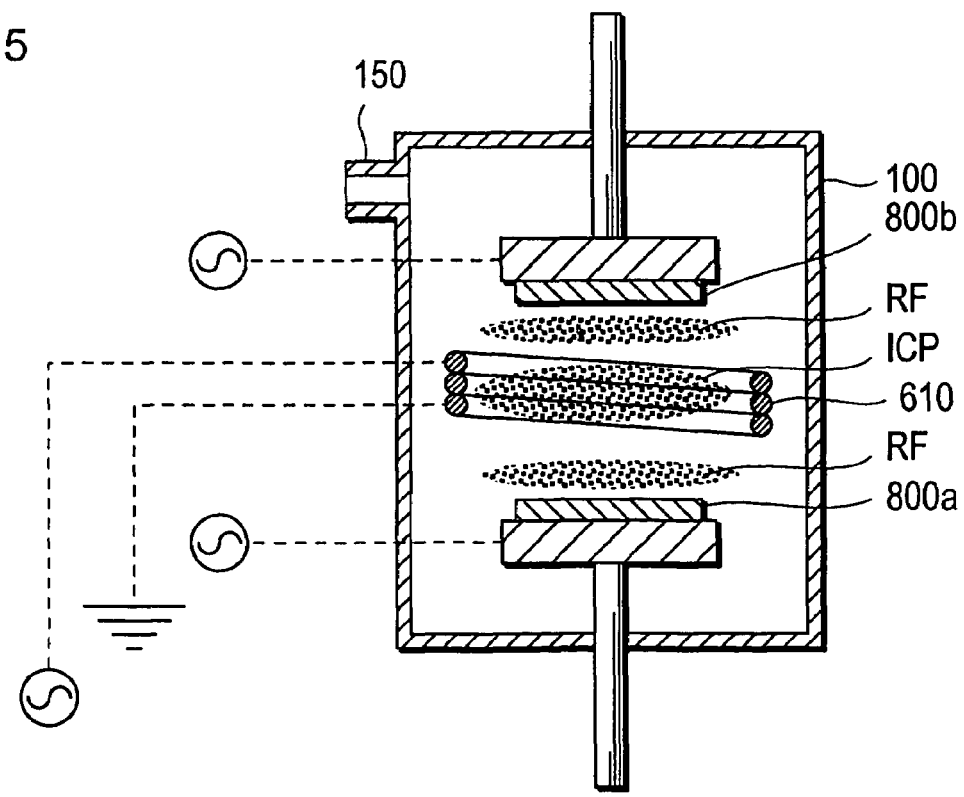
FIG. 15 is a diagram illustrating in type section the state which the irradiation mechanism of FIG. 14 assumes when it is irradiating an RF plasma.

FIG. 15 is a diagram illustrating in type section the state which the substrate bonding apparatus 10 assumes when the radiation of the RF plasma in process. To initiate the radiation of the RF plasma, the control part 300 effects such a control as to apply a high-frequency voltage to the coil 610 and, at the same time, apply a voltage to the first substrate 800*a* and the second substrate 800*b*.

In the neighborhood of the coil 610, the inductively coupled plasma is generated as will be specifically described herein below and, by virtue of the automatic C-bias, induced to give rise to a potential difference between the coil 610 and the first electrode 800*a* and between the coil 610 and the second electrode 800*b*. As a result, the RF plasma is generated each in the space between the coil 610 and the first substrate 800*a* and in the space between the coil 610 and the second substrate 800*b*. Particularly the RF plasma is generated in the neighborhoods of the first substrate 800*a* and the second substrate 800*b*. Then, the generated RF plasma is made to irradiate the surfaces of the first substrate 800*a* and the second substrate 800*b*. Ideally, by carrying out the preceding procedure while continuing the supply of oxygen gas, the oxygen plasma is generated in the space between the coil 610 and the first substrate 800*a* and in the space between the coil 610 and the second substrate 800*b* and this oxygen plasma is induced to irradiate the surfaces of the first substrate 800*a* and the second substrate 800*b*.

(Process for Radiating Radical and/or Ion Generated from Inductively Coupled Plasma)

Figure 16:
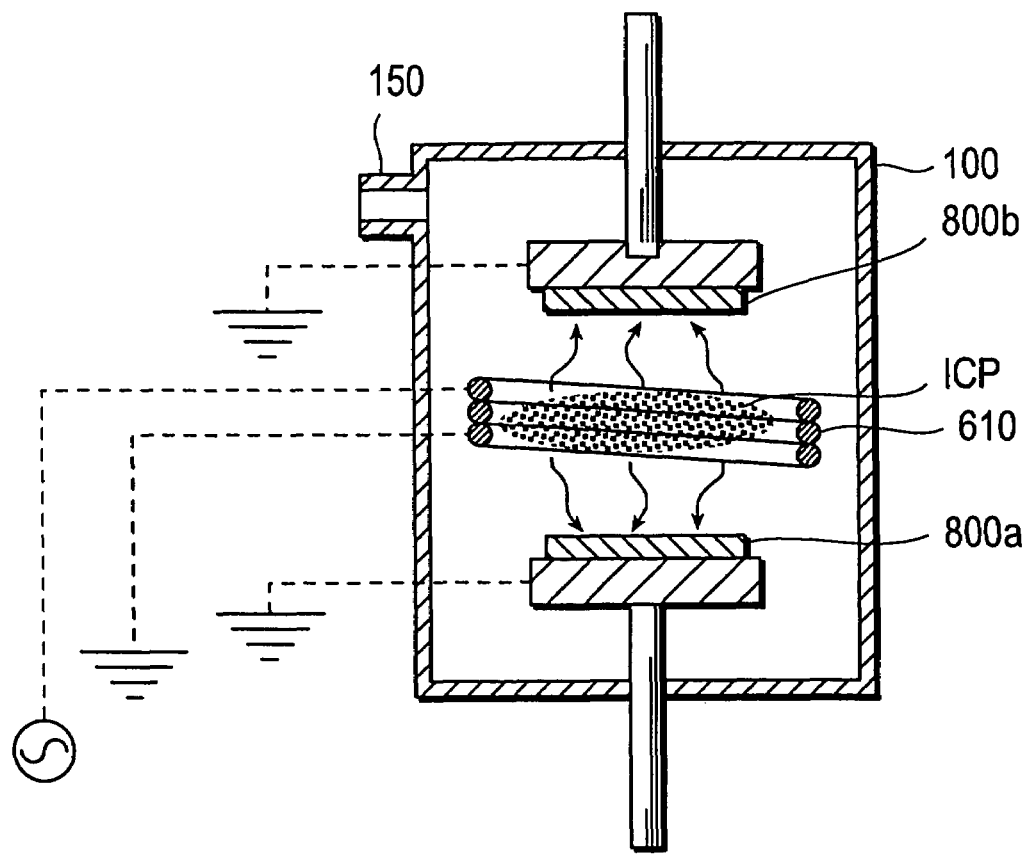
FIG. 16 is a diagram illustrating in type section the state which the irradiation mechanism of FIG. 14 assumes when it is irradiating an ion and/or a radical generated from an inductively coupled plasma.

FIG. 16 is a diagram illustrating in type section the state which the radiation mechanism assumes during the radiation of a radical and/or ion generated from an inductively coupled plasma.

To initiate the radiation of the radical and/or the ion generated from the inductively coupled plasma, the control part 300 effects such a control as to ground the first substrate 800*a* and the second substrate 800*b* and, at the same time, apply a high-frequency voltage to the coil 610.

The application of the high-frequency voltage to the coil 610 results in generating a high-frequency induction field. Then, by the induction magnetic field which is generated by this high-frequency induction field, the electrons are accelerated and consequently enabled to generate a plasma (inductively coupled plasma) in the neighborhood of the coil 610. The ion and/or the radical or the like generated from the inductively coupled plasma are caused as by the diffusion mechanism to irradiate the surfaces of the first substrate 800*a* and the second substrate 800*b*. Ideally, by performing the preceding procedure while continuing the supply of nitrogen, the nitrogen plasma is generated in the neighborhood of the coil 610 and the nitrogen ion and/or the nitrogen radical generated from the nitrogen plasma are induced to irradiate the surfaces of the first substrate 800*a* and the second substrate 800*b*.

After the radiation of the oxygen plasma and the nitrogen radical has been completed, the first substrate 800*a* and the second substrate 800*b* are stacked and their surfaces which have undergone the irradiation are brought into close mutual contact to effect mutual bonding of the two substrates. In this case, the first substrate 800*a* and the second substrate 800*b* may be brought into mutual contact and then bonded by moving the first supporting part 130 and the second supporting part 140 in a vertical direction while keeping the first substrate 800*a* and the second substrate 800*b* held fast on the first supporting part 130 and the second supporting part 140. Since the diameter of the coil 610 is larger than the diameters of the first substrate 800*a* and the second substrate 800*b*, the first substrate 800*a* and the second substrate 800*b* can move past the inside of the coil 610. As a result, the first substrate 800*a* and the second substrate 800*b* can be bonded without suffering the first substrate 800*a* and the second substrate 800*b* to interfere with the coil 610.

The first through fifth modes of embodiment have been described thus far. Next, the results of an actual experiment performed with a view to clarifying the operation and effect of this invention will be shown below as a working example.

Example

The present working example was carried out by using an apparatus depicted in the third embodiment described above (FIG. 11). FIG. 17 is a diagram showing the results of a test for tensile strength performed in the present working example and FIG. 18 is a diagram showing the conditions for bonding substrates. As the conditions for bonding substrates, the pressure of oxygen was set at 30 (Pa) and the pressure of nitrogen at 100 (Pa) as shown in FIG. 18. As the RF voltage, a voltage 200 V in force and 13.4 MHz in frequency was used. The micro-wave power as set at 2000 W. The durations of the process of plasma radiation and radical radiation were each fixed at 60 seconds.

FIG. 17 depicts a comparative example besides the present working example. Specifically, it shows (1) the case of sole radiation of oxygen radical, (2) the case of sole radiation of nitrogen radical, (3) the case of sole radiation of oxygen plasma, (4) the case of sole radiation of nitrogen plasma, (5) the case of sole radiation of argon ion beam, (6) the case of radiation of nitrogen plasma and subsequent radiation of oxygen radical, (7) the case of radiation of nitrogen plasma and subsequent radiation of oxygen plasma, (8) the case of radiation of oxygen radical and subsequent radiation of nitrogen radical, (9) the case of radiation of oxygen plasma and subsequent radiation of nitrogen radical (referred to as "Referential Example 1)," (10) the case of radiation of oxygen plasma and subsequent radiation of nitrogen radical (referred to as "Best Example"), (11) the case of plasma radiation of the mixture of oxygen and nitrogen (referred to as "Referential Example 2"), and (12) the case of radical radiation of the mixture of oxygen and nitrogen.

The expression "limit of adhesive agent" as used in FIG. 17 refers to the case of suffering detachment of the adhesive part bonding the tensile strength tester and a substrate prior to exfoliation of the mutually bonded substrates. This detachment occurs when the substrates are in a state of being mutually bonded strongly. The parts which have the entry of "X" in FIG. 17 each indicate a case of failing to bond the substrates.

As shown in FIG. 17, (10) when the radiation of nitrogen radical followed the radiation of oxygen plasma (the case of "best example"), the substrates were mutually bonded most strongly and they induced no mutual separation even when they were drawn away from each other with a strength exceeding 18.9 MPa and 20 MPa.

Then, it was found that (9) when the radiation of nitrogen plasma followed the radiation of oxygen plasma (the case of "Referential Example 1") and (11) when the mixture of oxygen and nitrogen was subjected to plasma projection (the case of "Referential Example 2"), the substrates were bonded comparatively strongly, through inferiorly as compared with the case of the best example mentioned above.

Meanwhile, the substrates were not bonded when the oxygen plasma or the nitrogen plasma was solely radiated, when the oxygen radical or the nitrogen radical was solely radiated. They were not strongly bonded when the radiation of nitrogen plasma or nitrogen radical preceded the projection of oxygen plasma or oxygen radical.

From these results, it is clear that the substrates can be bonded comparatively strongly by subjecting them to the radiation of nitrogen radical or oxygen plasma simultaneously with or subsequently to the radiation of oxygen plasma and thereafter stacking the substrates mutually. The case of making the radiation "simultaneously" as mentioned herein embraces the case of mixing oxygen and nitrogen and subjecting the produced mixture to plasma radiation (the case of Referential Example 2 mentioned above).

It has been made clear that stronger bonding of the substrates is realized in the case of performing the radiation of radical simultaneously with or subsequently to the radiation of plasma than in any of the other cases. It has been made clear that the most favorable bonding of the substrates is obtained particularly when the step for radiating nitrogen radical is executed continuously after the step for radiating oxygen plasma has been completed.

The preceding description has demonstrated a novel substrate bonding technique which is expected to attain mutual bonding of substrates by performing the step for radiating nitrogen particle beam simultaneously with or subsequently to the step for radiating oxygen particle beam and thereafter stacking the substrates mutually. From a different point of view, that description may well be said to have demonstrated a novel substrate bonding technique which is expected to effect mutual bonding of the substrates by performing the radical radiation simultaneously with or subsequently to the plasma radiation and thereafter stacking the substrates mutually. Particularly, it has demonstrated an effective substrate bonding technique which consists in performing the radiation of nitrogen radical continuously after the step for radiating oxygen plasma has been completed and thereafter stacking the substrates mutually.

The construction which is used in the first through fifth modes of embodiment with the object of irradiating substrates with plasma and radical, as novel apparatus and method for radiation by themselves, are expected to find utility not only in the field of bonding substrates but also in a wide range of fields. It enjoys prominent usefulness particularly because the radiation of plasma and the radiation of radical both can be easily and conveniently realized with one device by simply controlling the state of application of voltage to the first electrode, the second substrate, and the substrates and the state of grounding them.

Preferred modes of embodying this invention have been described thus far. It goes without saying that they ought to allow persons skilled in the art to make various omissions from, additions to, and alterations in this invention.

The preceding embodiment, for example, represents the case of performing the operation of bonding substrates in the air at room temperature. This invention does not need to limit the operation to these particular conditions. The operation of bonding substrates may be carried out in vacuum, for example. An experiment has shown that when silicon substrates are mutually bonded in vacuum (100° C., seven hours), they are bonded so strongly that they will not be separated from each other even by a pull with a force exceeding 27.3 MPa.

Further, though the preceding mode of embodiment has represented the case of using silicon substrates as the substrates to be bonded, it goes without saying that this invention can be utilized even when substrates of other kind are given to be bonded. In an experiment, when silicon substrates having a thermal oxidation film ($SiO_2$) formed in a thickness of 500 nm on the surfaces thereof were bonded, it was found that they could be strongly bonded. Specifically, this experiment showed that when the radiation of nitrogen radical followed the radiation of oxygen plasma, the bonded substrates were not separated even by a pull with a force exceeding 25.6 MPa (no mutual separation of the substrates occurred till the adhesive agent succumbed to dissociation). Even in the case of performing the radiation of a plasma which was formed with the mixture of oxygen and nitrogen, the substrates were bonded comparatively strongly in spite of the separation of the surfaces of the substrates by a pull with a force of 13.5 MPa and 7.45 MPa.

Owing to the novel substrate bonding technique resorting to the combined use of the plasma radiation and the radical radiation, the bonding of substrates with strength of the level not easily attained by the conventional plasma assist bonding technique can be accomplished. This invention, therefore, can be extensively applied to the operation of bonding varying substrates made of semiconductors, ceramics, oxides, or metals.

While the invention has been described with reference to the preferred embodiment thereof, it will be appreciated by those of ordinary skill in the art that modifications can be made to the parts that comprise the invention without departing from the spirit and scope thereof.

What is claimed is:

1. A substrate bonding method for mutually bonding substrates, comprising:
    a first radiation step for irradiating the surfaces of the individual substrates with an oxygen plasma beam,
    a second radiation step for irradiating the surfaces of the individual substrates with a nitrogen radical beam subsequently to said first radiation step, wherein the nitrogen radical is extracted from a nitrogen plasma, and
    a bonding step for bonding the individual substrates to each other at a temperature between room temperature and 100° C. by stacking the individual substrates and bringing the surfaces thereof into close contact subsequently to said first and second radiation steps.

2. A method according to claim 1, which further comprises a step for radiating an inert gas neutral atom beam prior to said first radiation step.

3. A method according to claim 1, wherein said first radiation step, said second radiation step, and said bonding step are carried out in vacuum.

4. A substrate bonding method for mutually bonding substrates, comprising:
    a first radiation step for irradiating the surfaces of the individual substrates with an oxygen plasma beam, a second radiation step for irradiating the surfaces of the individual substrates with a nitrogen radical beam subsequently to said first radiation step, a bonding step for bonding the individual substrates to each other at a temperature between room temperature and 100° C. by stacking the individual substrates and bringing the surfaces thereof into close contact subsequently to said first and second radiation steps and, a step for disposing a substrate, a first electrode furnished with openings, and a second electrode sequentially in the order mentioned, wherein said first radiation step includes a step for grounding said first electrode while applying a high-frequency voltage to said substrate thereby inducing generation of an oxygen plasma in a space between said first electrode and said substrate, and irradiating the surface of the substrate with the generated oxygen plasma and wherein said second radiation step includes a step for grounding said first electrode while applying a high-frequency voltage to said second electrode thereby inducing generation of a nitrogen plasma in a space between said first electrode and said second electrode, and enabling a nitrogen radical passed through said openings of said first electrode in consequence of the generation of said nitrogen plasma to irradiate the surface of the substrate.

5. A method according to claim 4, which further comprises a step for applying a voltage to an inner electrode disposed in a space between said first electrode and said second electrode while grounding said first electrode and said second electrode and enabling an inert gas neutral atom beam which has passed through said openings in said first electrode to irradiate the surface of said substrate.

6. A substrate bonding method for mutually bonding substrates, comprising:

a first radiation step for irradiating the surfaces of the individual substrates with an oxygen plasma beam, a second radiation step for irradiating the surfaces of the individual substrates with a nitrogen radical beam subsequently to said first radiation step, a bonding step for bonding the individual substrates to each other at a temperature between room temperature and 100° C. by stacking the individual substrates and bringing the surfaces thereof into close contact subsequently to said first and second radiation steps and, a step for disposing a first substrate, a first electrode furnished with a first opening, a second electrode furnished with a second opening, and a second substrate sequentially in the order mentioned, wherein said first radiation step includes a step for grounding said first electrode and said second electrode while applying a high-frequency voltage to said first substrate and said second substrate thereby inducing generation of an oxygen plasma in a space between said second electrode and said second substrate, and simultaneously irradiating the surfaces of the first substrate and the second substrate with the oxygen plasma, wherein said second radiation step includes a step for grounding said first electrode while applying a high-frequency voltage to said second electrode thereby inducing generation of a nitrogen plasma in a space between said first electrode and said second electrode, and enabling a nitrogen radical passed through said first opening of said first electrode in consequence of said generation of nitrogen plasma to irradiate the surface of the first substrate, and a step for grounding said second substrate while applying a high-frequency voltage to said first electrode thereby inducing generation of a nitrogen plasma in a space between said first electrode and said second electrode and enabling a nitrogen radical passed through said second opening of said second electrode in consequence of said generation of nitrogen plasma to irradiate the surface of the second substrate.

7. A substrate bonding method for mutually bonding substrates, comprising:

a first radiation step for irradiating the surfaces of the individual substrates with an oxygen plasma beam, a second radiation step for irradiating the surfaces of the individual substrates with a nitrogen radical beam subsequently to said first radiation step, a bonding step for bonding the individual substrates to each other at a temperature between room temperature and 100° C. by stacking the individual substrates and bringing the surfaces thereof into close contact subsequently to said first and second radiation steps and, a step for disposing a first substrate, a coil, and a second substrate sequentially in the order mentioned, wherein said first step includes a step for applying a high-frequency voltage to each of said first substrate, said second substrate, and said coil thereby inducing an oxygen plasma in a space between said first substrate and said oil and in a space between said second substrate and said coil and enabling said oxygen plasma to irradiate the surfaces of said first substrate and second substrate, and wherein said second step includes a step for grounding said first substrate and said second substrate while applying a high-frequency voltage to said coil thereby inducing generation of an inductively coupled plasma with nitrogen as gas seed in the neighborhood of said coil and enabling a nitrogen ion and/or a nitrogen radical generated in consequence of said inductively coupled plasma to irradiate the surfaces of said first substrate and said second substrate.

* * * * *